(12) United States Patent
Zhang et al.

(10) Patent No.: US 12,342,586 B2
(45) Date of Patent: Jun. 24, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yanhong Zhang, Hefei (CN); Peng Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 461 days.

(21) Appl. No.: 17/806,306

(22) Filed: Jun. 10, 2022

(65) Prior Publication Data

US 2023/0027860 A1  Jan. 26, 2023

Related U.S. Application Data

(63) Continuation of application No. PCT/CN2022/076313, filed on Feb. 15, 2022.

(30) Foreign Application Priority Data

Jul. 22, 2021  (CN) .......................... 202110833194.3

(51) Int. Cl.
  *H10D 62/10*   (2025.01)
  *H01L 21/762*  (2006.01)

(52) U.S. Cl.
  CPC ..... *H10D 62/115* (2025.01); *H01L 21/76224* (2013.01)

(58) Field of Classification Search
  CPC .................. H10D 62/115; H01L 21/76224
  See application file for complete search history.

(56) References Cited

U.S. PATENT DOCUMENTS

| 7,199,022 B2 | 4/2007 | Yasui et al. |
| 7,589,391 B2 | 9/2009 | Ohta et al. |

(Continued)

FOREIGN PATENT DOCUMENTS

| CN | 1445835 A | 10/2003 |
| CN | 100334708 C | 8/2007 |

(Continued)

OTHER PUBLICATIONS

International Search Report cited in PCT/CN2022/076313 mailed Apr. 19, 2022, 9 pages.

*Primary Examiner* — Dao H Nguyen
(74) *Attorney, Agent, or Firm* — Kilpatrick Townsend & Stockton LLP

(57) ABSTRACT

The present disclosure provides a semiconductor structure and a manufacturing method thereof. The manufacturing method of a semiconductor structure includes providing a substrate having trenches, regions other than the trenches in the substrate form a plurality of active regions at intervals; forming a first isolation layer and a second isolation layer, a top surface of the first isolation layer is lower than a top surface of the second isolation layer, a groove is formed between the second isolation layer and the active region; forming a barrier layer in the groove, an etching rate of the barrier layer is lower than an etching rate of the first isolation layer; and forming a third isolation layer in an intermediate trench, the intermediate trench is filled with the third isolation layer, and the first isolation layer, the second isolation layer, the third isolation layer, and the barrier layer form an isolation structure.

13 Claims, 6 Drawing Sheets

(56) References Cited

U.S. PATENT DOCUMENTS

| | | | |
|---|---|---|---|
| 11,101,347 B2* | 8/2021 | Yu | H01L 29/66545 |
| 2001/0021567 A1 | 9/2001 | Takahashi | |
| 2002/0142564 A1 | 10/2002 | Kumamoto | |
| 2005/0218448 A1* | 10/2005 | Kim | H01L 21/823456 |
| | | | 257/E21.624 |
| 2013/0344677 A1* | 12/2013 | Doris | H01L 29/0649 |
| | | | 257/E21.546 |
| 2014/0048856 A1* | 2/2014 | Song | H01L 21/823807 |
| | | | 257/288 |
| 2014/0225219 A1* | 8/2014 | Huang | H01L 29/0649 |
| | | | 438/424 |
| 2021/0098571 A1* | 4/2021 | Lai | H01L 21/76224 |

FOREIGN PATENT DOCUMENTS

| | | |
|---|---|---|
| CN | 106298630 A | 1/2017 |
| CN | 113035871 A | 6/2021 |

\* cited by examiner

Provide a substrate, where trenches are provided in the substrate, and regions other than the trenches in the substrate form a plurality of active regions at intervals — S100

Form a first isolation layer and a second isolation layer that are sequentially stacked on an inner wall of the trench, where a top surface of the first isolation layer is lower than a top surface of the second isolation layer, such that a groove is formed between the second isolation layer and the active region, and the second isolation layer defines an intermediate trench in the trench — S200

Form a barrier layer in the groove, where an etching rate of the barrier layer is lower than an etching rate of the first isolation layer — S300

Form a third isolation layer in the intermediate trench, where the intermediate trench is filled with the third isolation layer, and the first isolation layer, the second isolation layer, the third isolation layer, and the barrier layer form an isolation structure — S400

FIG. 4

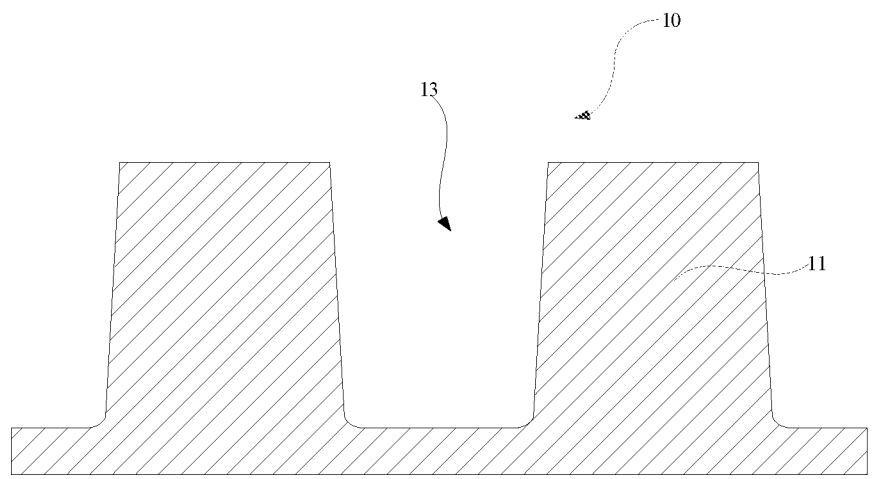

FIG. 5

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/076313, filed on Feb. 15, 2022, which claims the priority to Chinese Patent Application 202110833194.3, titled "SEMICONDUCTOR STRUCTURE AND MANUFACTURING METHOD THEREOF" and filed with the China National Intellectual Property Administration (CNIPA) on Jul. 22, 2021. The entire contents of International Patent Application No. PCT/CN2022/076313 and Chinese Patent Application 202110833194.3 are incorporated herein by reference.

TECHNICAL FIELD

The present disclosure relates to the technical field of semiconductors, and in particular to a semiconductor structure and a manufacturing method thereof.

BACKGROUND

Shallow trench isolation (STI) structures are widely used in semiconductor structures to achieve isolation between adjacent active regions.

In the related art, a trench is generally formed in the substrate first, and then the trench is filled with an isolation dielectric by a deposition process to form the STI structure.

However, when other devices are subsequently prepared on the substrate, the isolation dielectric in contact with the active region will be missing, resulting in a gap between the active region and the semiconductor structure, which increases the risk of electric leakage between adjacent active regions and reduces the performance of the semiconductor structure.

SUMMARY

According to a first aspect, an embodiment of the present disclosure provides a manufacturing method of a semiconductor structure, including:
  providing a substrate, where trenches are provided in the substrate, and regions other than the trenches in the substrate form a plurality of active regions at intervals;
  forming a first isolation layer and a second isolation layer that are sequentially stacked on an inner wall of the trench, where a top surface of the first isolation layer is lower than a top surface of the second isolation layer, such that a groove is formed between the second isolation layer and the active region, and the second isolation layer defines an intermediate trench in the trench;
  forming a barrier layer in the groove, where an etching rate of the barrier layer is lower than an etching rate of the first isolation layer; and
  forming a third isolation layer in the intermediate trench, where the intermediate trench is filled with the third isolation layer, and the first isolation layer, the second isolation layer, the third isolation layer, and the barrier layer form an isolation structure.

According to a second aspect, an embodiment of the present disclosure provides a semiconductor structure, including: a substrate, where trenches are provided in the substrate, and regions other than the trenches in the substrate form a plurality of active regions at intervals;
  a first isolation layer, where the first isolation layer is provided on an inner wall of the trench;
  a second isolation layer, where the second isolation layer is provided on the first isolation layer, and a top surface of the second isolation layer is higher than a top surface of the first isolation layer, such that the second isolation layer and the substrate define a groove;
  a barrier layer, where the barrier layer is provided in the groove, and an etching rate of the barrier layer is lower than an etching rate of the first isolation layer; and
  a third isolation layer, where the third isolation layer is provided on an inner wall of the second isolation layer, and a region defined by the second isolation layer is filled with the third isolation layer.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

FIG. 4 is a process flowchart of a manufacturing method of a semiconductor structure according to an embodiment of the present disclosure;

FIG. 5 is a schematic structural diagram of a trench in a manufacturing method of a semiconductor structure according to an embodiment of the present disclosure;

DETAILED DESCRIPTION

As described in the background, electric leakage occurs between adjacent active regions of a semiconductor structure, because an STI structure between adjacent active regions is prone to missing, and a voltage applied to an active region may be applied to its neighboring active region, resulting in a leakage current between the adjacent active regions.

Figure 1:
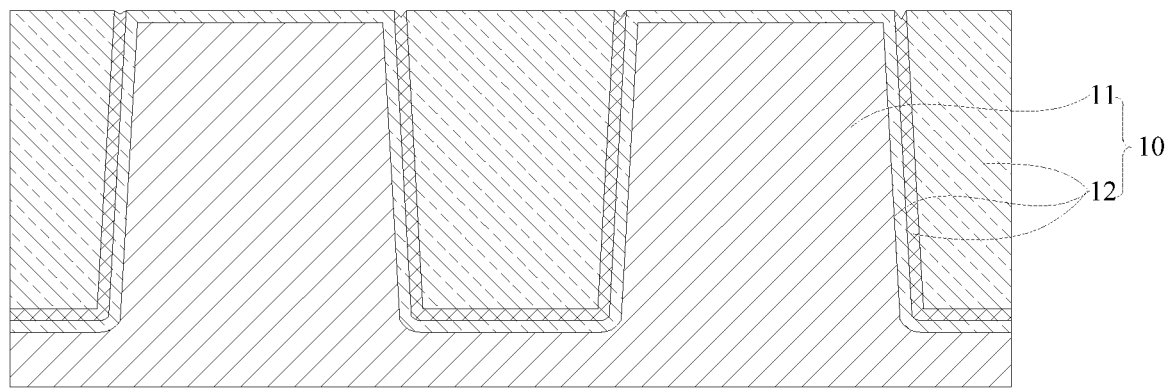
FIG. 1 is a schematic structural diagram of a substrate in the related art.
Figure 2:
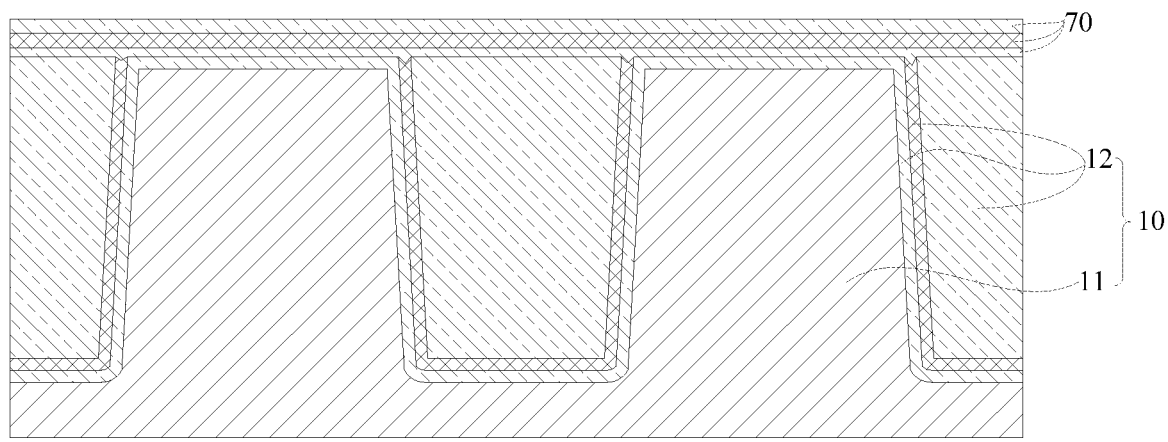
FIG. 2 is a schematic structural diagram of forming a dielectric layer in the related art.
Figure 3:
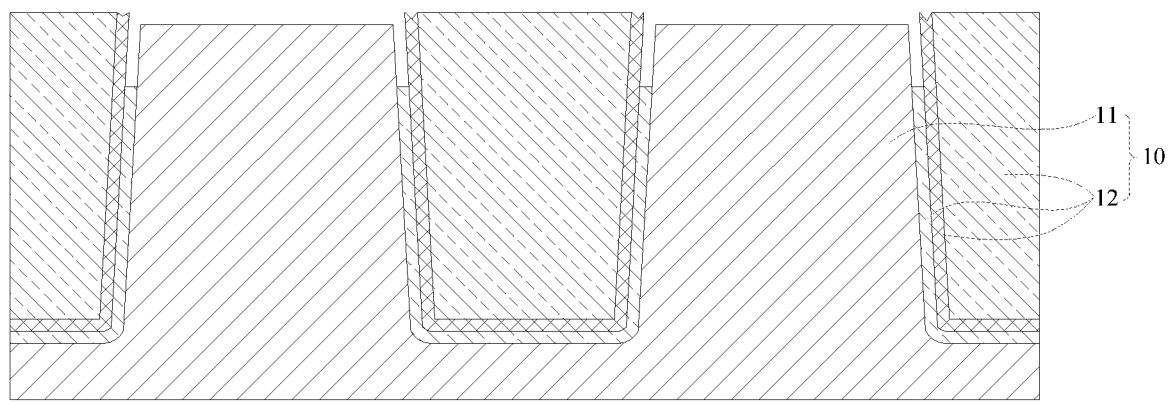
FIG. 3 is a schematic structural diagram of removing a dielectric layer in the related art.

Upon research, the inventors find that the missing of STI structure between adjacent active regions is mainly caused by the reason as follows: A semiconductor structure generally includes array regions and peripheral circuit regions connected to the array regions. As shown in FIG. 1 to FIG. 3, the array region and the peripheral circuit region each include a substrate 10 and an STI structure 12 provided in the substrate 10. When a bit line and isolation sidewalls arranged at both sides of the bit line are formed on the array region, a film layer of the isolation sidewall will also be formed on the peripheral circuit region, to form a dielectric layer 70 on the substrate 10 of the peripheral circuit region. When a control circuit is formed on the peripheral circuit region, the dielectric layer 70 located on the substrate 10 of the peripheral circuit region needs to be removed. However, in the process of removing the dielectric layer 70, the STI structure 12 in the peripheral circuit region is easily over-etched, causing missing of the STI structure 12, and a leakage current easily occurs between adjacent active regions 11.

To solve the foregoing technical problem, in the embodiment of the present disclosure, a groove is formed between a second isolation layer and an active region, and a barrier layer is formed in the groove, where an etching rate of the barrier layer is lower than an etching rate of the first isolation layer, such that the barrier layer will not be over-etched in the subsequent process of removing other film layers on the substrate through etching, thereby avoiding missing of the isolation structure. In this way, a leakage current between adjacent active regions can be avoided, thus improving the performance of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely a part rather than all of the embodiments of the present disclosure. All other embodiments obtained by those of ordinary skill in the art based on the embodiments of the disclosure without creative efforts shall fall within the protection scope of the present disclosure.

FIG. 4 is a flowchart of a manufacturing method of a semiconductor structure according to an embodiment of the present disclosure. FIG. 4 to FIG. 15 are schematic diagrams of various stages in a manufacturing method of a semiconductor structure. The manufacturing method of a semiconductor structure will be described in detail below with reference to FIG. 4 to FIG. 15.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 4, an embodiment of the present disclosure provides a manufacturing method of a semiconductor structure, including the following steps:

Step S100: Provide a substrate, where trenches are provided in the substrate, and regions other than the trenches in the substrate form a plurality of active regions at intervals.

For example, as shown in FIG. 5, a substrate 10 serves as a support member of the DRAM and is used to support other components thereon. The substrate 10 may be made of a semiconductor material. The semiconductor material may be one or more of a group consisting of silicon, germanium, a silicon-germanium compound, and a silicon-carbon compound.

A trench 13 is provided in the substrate 10. The trench 13 is used for dividing the substrate 10 into a plurality of active regions 11 independent of each other. The plurality of active regions 11 can be arranged in the form of an array in the substrate 10.

The active region 11 can be used for forming a semiconductor device. For example, the active region 11 formed in an array region is used for forming a semiconductor device such as a transistor or a capacitor. For another example, the active region 11 formed in a peripheral circuit region is used for forming a control circuit, such as a logic transistor.

It should be noted that, FIG. 5 only shows the active region in the peripheral circuit region, and the active region 11 in the array region is not shown.

Step S200: Form a first isolation layer and a second isolation layer that are sequentially stacked on an inner wall of the trench, where a top surface of the first isolation layer is lower than a top surface of the second isolation layer, such that a groove is formed between the second isolation layer and the active region, and the second isolation layer defines an intermediate trench in the trench.

Figure 6:
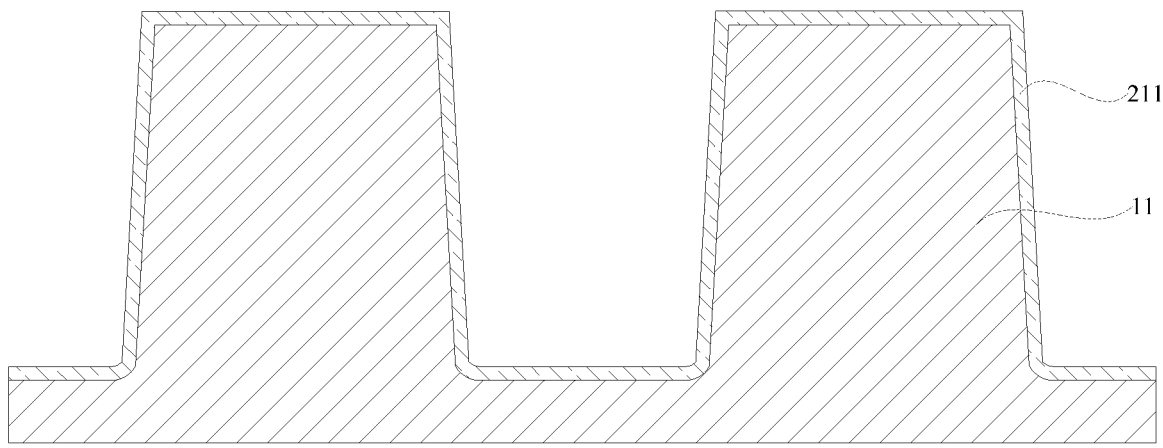
FIG. 6 is a schematic structural diagram of forming a first initial isolation layer in a manufacturing method of a semiconductor structure according to an embodiment of the present disclosure.

For example, as shown in FIG. 6, a first initial isolation layer 211 may be formed on the inner wall of the trench 13 through an atomic layer deposition process, and the first initial isolation layer 211 covers a top surface of the substrate 10.

Figure 7:
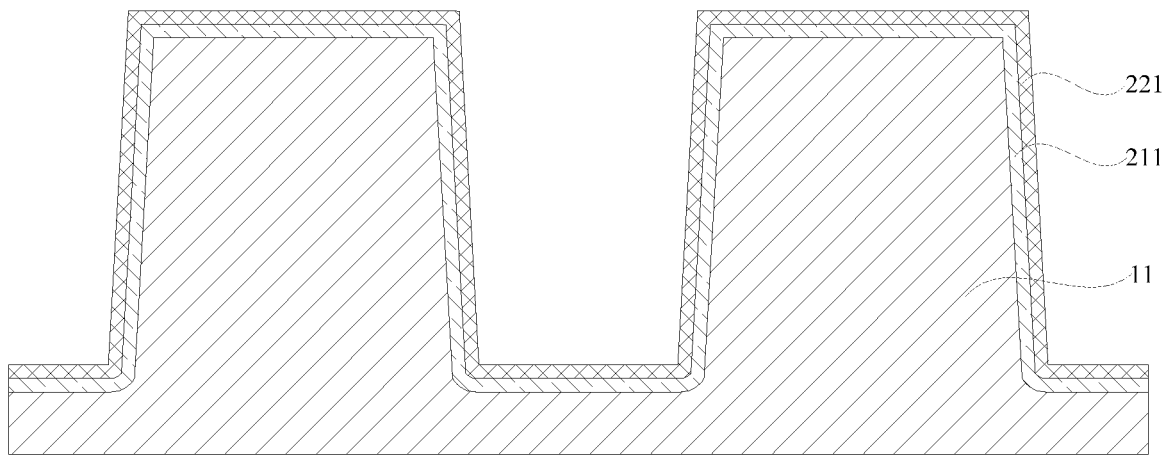
FIG. 7 is a schematic structural diagram of forming a second initial isolation layer in a manufacturing method of a semiconductor structure according to an embodiment of the present disclosure.

As shown in FIG. 7, after the first initial isolation layer 211 is formed, a second initial isolation layer 221 may further be formed on the first initial isolation layer 211 by using the atomic layer deposition process.

Then, the first initial isolation layer 211 located on the top surface of the substrate 10 and a part of the first initial isolation layer 211 located on a sidewall of the trench are removed, and the second initial isolation layer 221 located on the top surface of the substrate is also removed. The retained first initial isolation layer 211 forms the first isolation layer 21, the retained second initial isolation layer 221 forms the second isolation layer 22, and the second isolation layer 22 defines an intermediate trench 30 in the trench 13.

Figure 8:
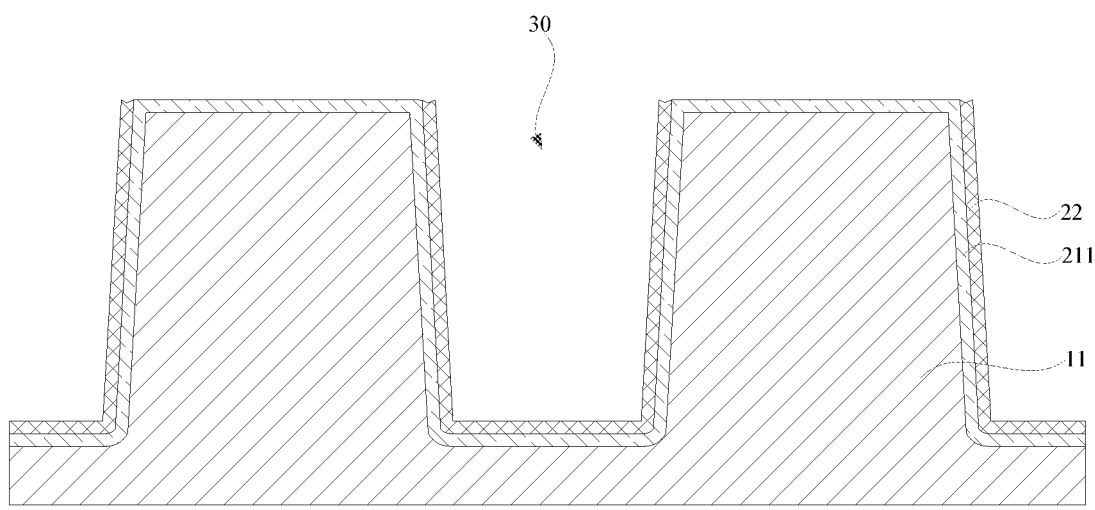
FIG. 8 is a diagram of forming a first isolation layer and a second isolation layer in a manufacturing method of a semiconductor structure according to an embodiment of the present disclosure.

For example, as shown in FIG. 8, the second initial isolation layer 221 located on the top surface of the substrate 10 may be removed by using an etching gas or an etching liquid, to expose the first initial isolation layer 211 located on the substrate 10, and the retained second initial isolation layer 221 forms the second isolation layer 22.

Figure 9:
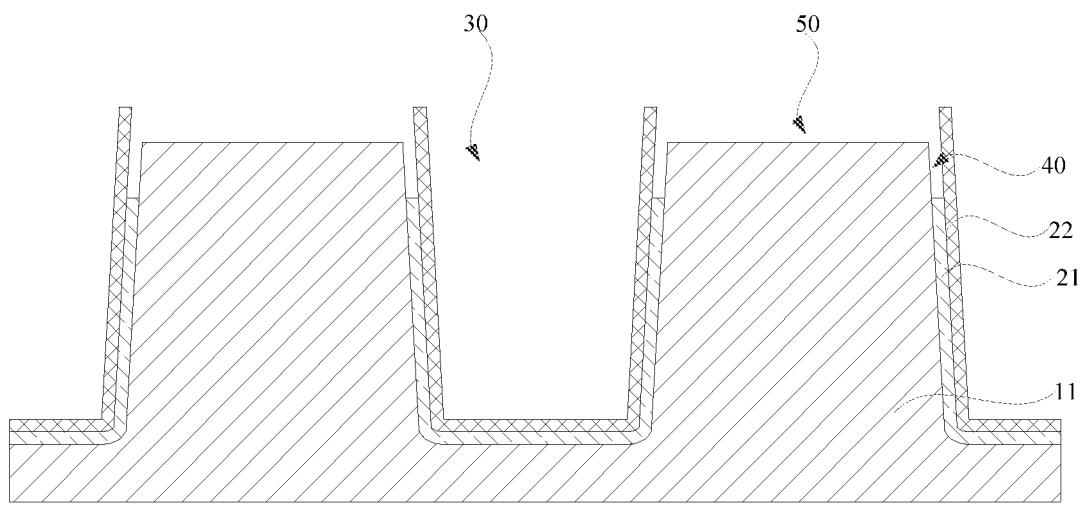
FIG. 9 is a schematic structural diagram of forming a first isolation layer and a second isolation layer in a manufacturing method of a semiconductor structure according to an embodiment of the present disclosure.

After the second isolation layer 22 is formed, as shown in FIG. 9, the first initial isolation layer 211 located on the top surface of the substrate 10 and a part of the first initial isolation layer 211 located on the sidewall of the trench are further removed by using an etching gas or an etching liquid, such that a groove 40 is formed between the second isolation layer 22 and the substrate 10.

If the depth of the groove is less than 60 nm, the barrier layer formed in the groove is not thick enough to prevent the first isolation layer from being over-etched. If the depth of the groove is greater than 80 nm, the groove is too deep, and when the second isolation layer is etched in the process of forming the groove, the performance of the semiconductor structure is affected. Therefore, in this embodiment, the depth of the groove is set in a range of 60 nm to 80 nm, which can prevent the first isolation layer from being over-etched and also ensure the performance of the semiconductor structure.

In this embodiment, a material of the first isolation layer includes silicon oxide, and a material of the second isolation layer includes silicon nitride.

Step S300: Form a barrier layer in the groove, where an etching rate of the barrier layer is lower than an etching rate of the first isolation layer.

Figure 10:
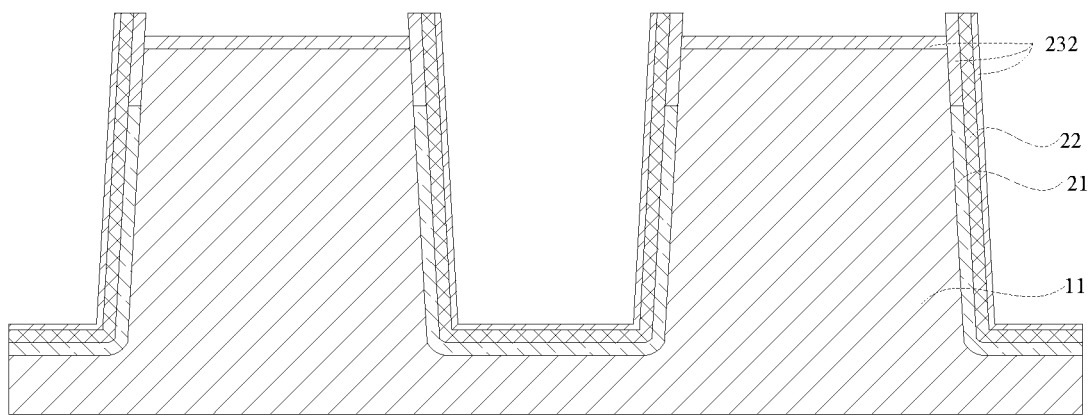
FIG. 10 is a schematic structural diagram of forming an initial barrier layer in a manufacturing method of a semiconductor structure according to an embodiment of the present disclosure.

For example, as shown in FIG. 10, an initial barrier layer 232 is formed in the groove 40. The initial barrier layer 232 extends to the outside of the groove 40, and covers a top surface of the active region 11 and an inner wall of the second isolation layer 22.

Figure 11:
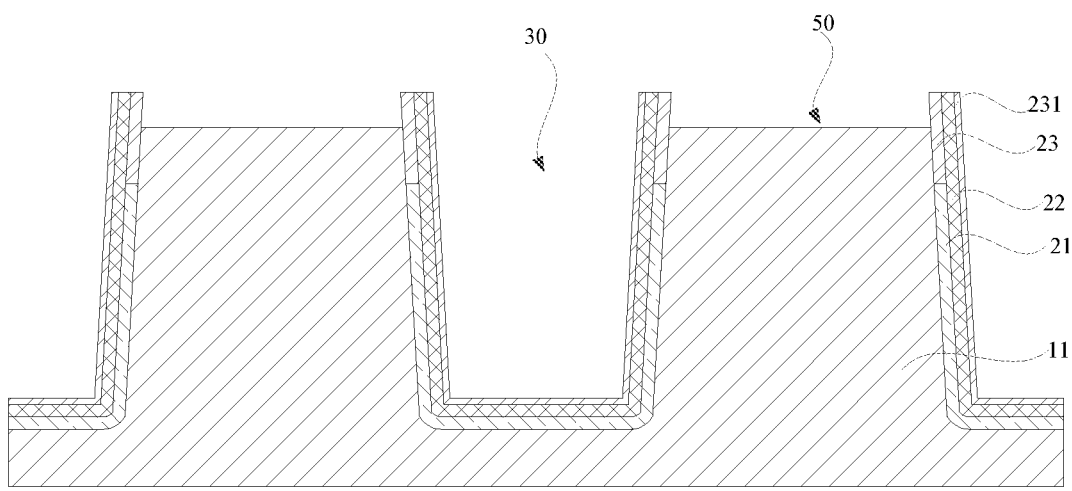
FIG. 11 is a schematic structural diagram of forming a barrier layer and an extension portion in a manufacturing method of a semiconductor structure according to an embodiment of the present disclosure.

As shown in FIG. 11, the initial barrier layer 232 located on the top surface of the active region 11 is removed. The initial barrier layer 232 retained in the groove 40 forms the barrier layer 23, and the initial barrier layer 232 retained on the inner wall of the second isolation layer 22 forms an extension portion 231. In other words, the extension portion 231 is located between the second isolation layer 22 and the third isolation layer.

In this embodiment, the etching rate of the barrier layer 23 is lower than the etching rate of the first isolation layer 21; that is, under the same etching condition, the barrier layer 23 will not be etched, thus preventing the first isolation layer 21 from being etched.

In addition, in this embodiment, by providing the extension portion 231, the thickness of the third isolation layer 24 can be reduced. The extension portion 231 with a lower etching rate is used to replace a part of the third isolation layer 24, which can minimize the damage to an isolation structure 20 in the subsequent process of removing other film layers on the substrate, thereby avoiding a leakage current between adjacent active regions and improving the performance of the semiconductor structure.

It should be noted that, in this embodiment, the extension portion may be provided on a sidewall of the intermediate trench only, or provided on a bottom wall of the intermediate trench only, or provided on both the sidewall and the bottom wall of the intermediate trench.

A material of the barrier layer 23 includes at least one of silicon carbide nitride, silicon carbon oxide, and silicon boron nitride. In other words, the material of the barrier layer 23 may be one or more of the foregoing three materials.

Step S400: Form a third isolation layer in the intermediate trench, where the intermediate trench is filled with the third isolation layer, and the first isolation layer, the second isolation layer, the third isolation layer, and the barrier layer form an isolation structure.

Figure 13:
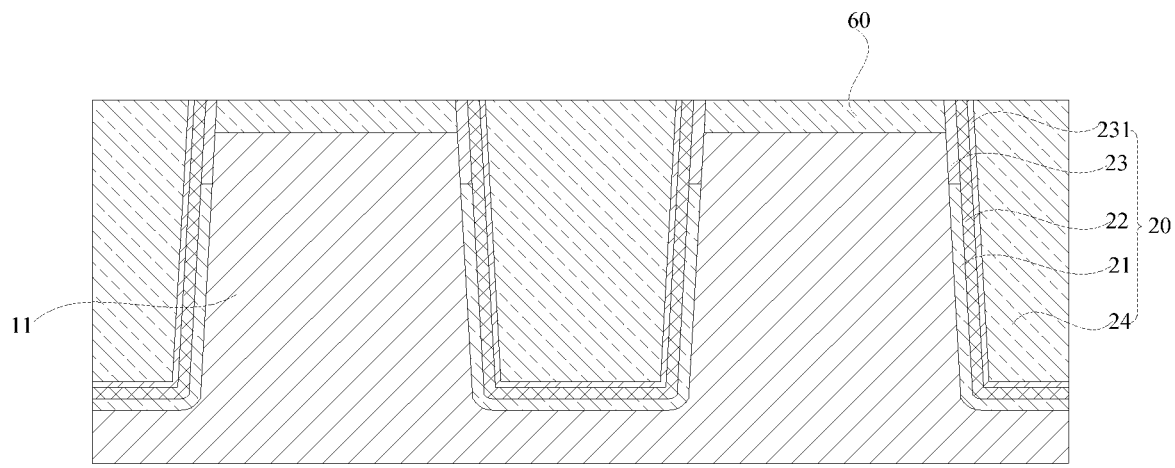
FIG. 13 is a schematic structural diagram of forming a third isolation layer and a gate oxide layer in a manufacturing method of a semiconductor structure according to an embodiment of the present disclosure.

For example, as shown in FIG. 13, the third isolation layer 24 may be formed in the intermediate trench 30 by using a physical vapor deposition process or a chemical vapor deposition process. The intermediate trench 30 is filled with the third isolation layer 24; the first isolation layer 21, the second isolation layer 22, the third isolation layer 24, and the barrier layer 23 form the isolation structure 20.

In some embodiments, further referring to FIG. 9 and FIG. 11, when the first initial isolation layer 211 located on the top surface of the substrate 10, a part of the first initial isolation layer 211 located on the sidewall of the trench 13, and the second initial isolation layer 221 located on the top surface of the substrate 10 are removed, the active region 11 is also removed by a certain thickness, and a filling region 50 is formed between the retained active region 11 and the barrier layer 23.

Figure 12:
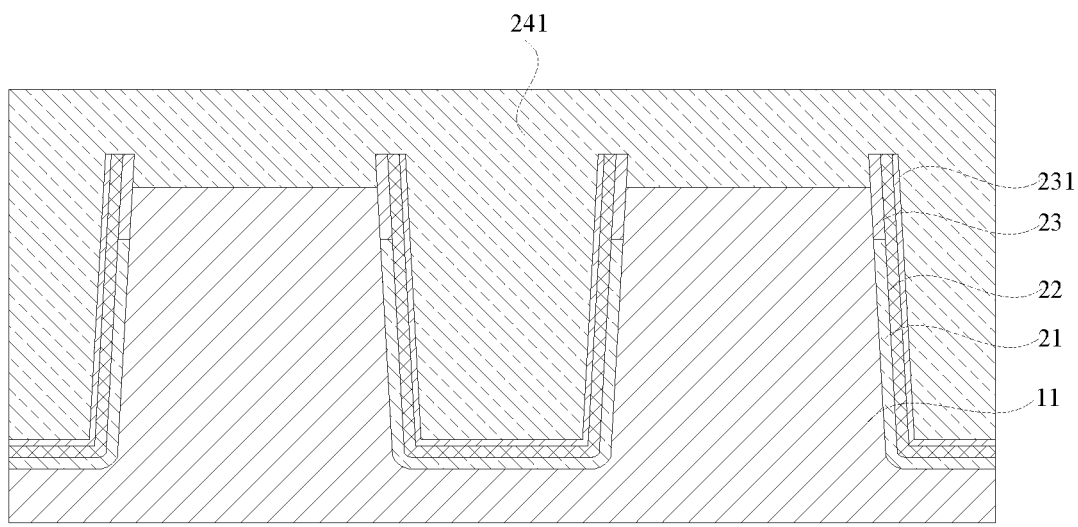
FIG. 12 is a schematic structural diagram of forming a third initial isolation layer in a manufacturing method of a semiconductor structure according to an embodiment of the present disclosure.

During forming of the third isolation layer, the third isolation layer will also be formed in the filling region 50. For example, as shown in FIG. 12, a third initial isolation layer 241 is formed in the intermediate trench 30, where the third initial isolation layer 241 extends to the outside of the intermediate trench 30, and covers the second isolation layer 22, the barrier layer 23, and the interior of the filling region 50.

As shown in FIG. 13, the third initial isolation layer is planarized by using a chemical mechanical polishing process, such that the third initial isolation layer 241 located in the intermediate trench 30 forms the third isolation layer 24, and the third initial isolation layer 241 located in the filling region 50 forms a gate oxide layer 60, where a top surface of the gate oxide layer 60 is flush with a top surface of the barrier layer 23.

In this embodiment, the third isolation layer formed in the filling region is used as the gate oxide layer, which can avoid forming a new gate oxide layer in the active region subsequently, thereby simplifying the manufacturing process of the semiconductor structure.

Figure 14:
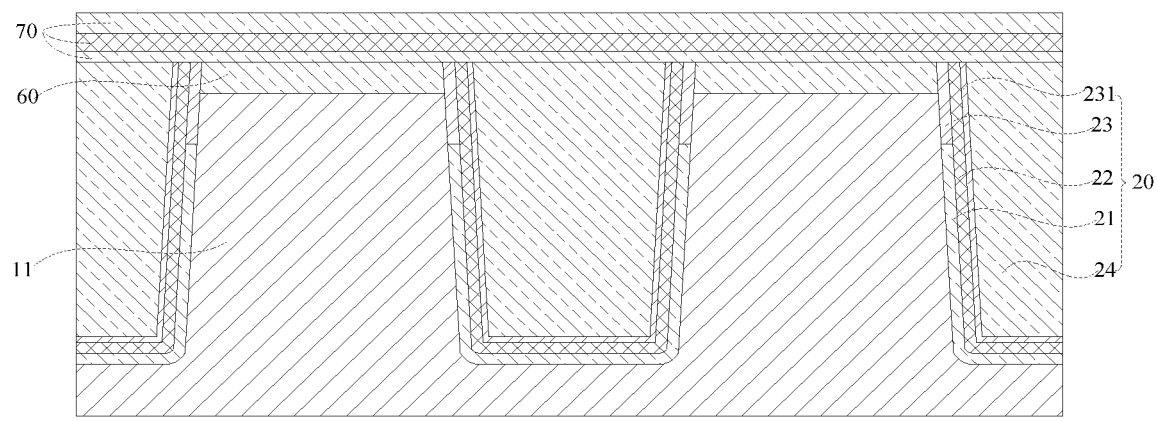
FIG. 14 is a schematic structural diagram of forming a dielectric layer in a manufacturing method of a semiconductor structure according to an embodiment of the present disclosure.

When a bit line and isolation sidewalls that are arranged at both sides of the bit line are formed on the array region, a film layer of the isolation sidewall will also be formed on the peripheral circuit region, so as to form a dielectric layer 70 on the substrate 10 of the peripheral circuit region, where the structure is as shown in FIG. 14. When a control circuit is formed on the peripheral circuit region, the dielectric layer 70 located on the substrate 10 of the peripheral circuit region needs to be removed. In this embodiment, the dielectric layer 70 is removed by using an etching gas. In this embodiment, since the isolation structure includes the barrier layer 23 having a relatively low etching rate, the barrier layer 23 will not be over-etched during removal of the dielectric layer 70, such that the isolation structure 20 will not be over-etched, thereby avoiding the leakage current between adjacent active regions 11 and improving the performance of the semiconductor structure.

Figure 15:
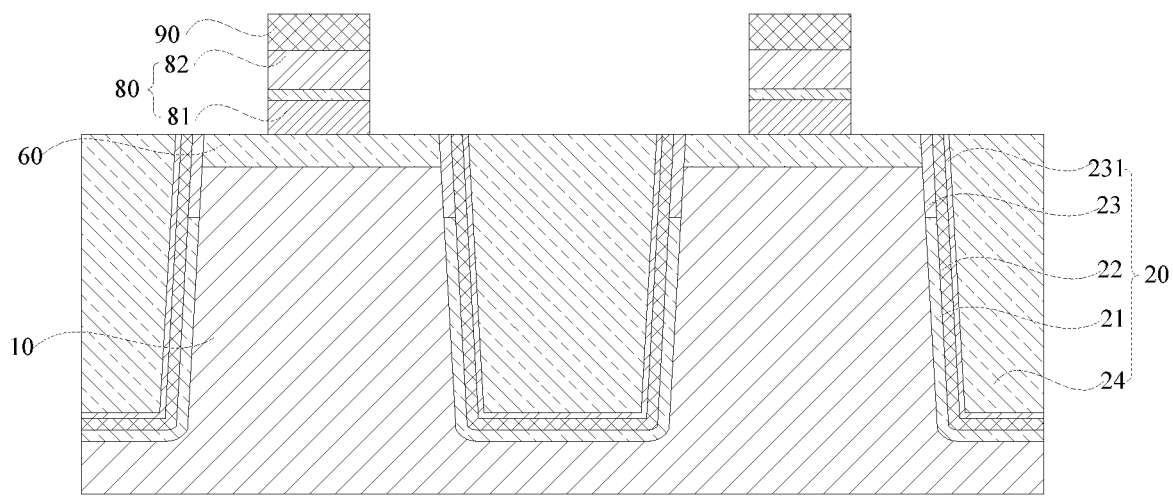
FIG. 15 is a schematic structural diagram of forming a gate structure and an insulating layer in a manufacturing method of a semiconductor structure according to an embodiment of the present disclosure.

In some embodiments, as shown in FIG. 15, after the step of planarizing the third initial isolation layer 241, the manufacturing method of a semiconductor structure further includes: forming a gate structure 80 and an insulating layer 90 that are sequentially stacked on the gate oxide layer 60, where the gate oxide layer 60, the gate structure 80, and the insulating layer 90 form a transistor.

Further referring to FIG. 15, an embodiment of the present disclosure further provides a semiconductor structure, including: a substrate 10, a first isolation layer 21, a second isolation layer 22, a barrier layer 23, and a third isolation layer 24.

Trenches are provided in the substrate 10, and regions other than the trenches in the substrate 10 form a plurality of active regions at intervals. The first isolation layer 21 is provided on an inner wall of the trench, the second isolation layer 22 is provided on the first isolation layer 21, and a top surface of the second isolation layer 22 is higher than a top surface of the first isolation layer 21, such that the second isolation layer 22 and the substrate 10 define a groove.

The barrier layer 23 is provided in the groove, and an etching rate of the barrier layer 23 is lower than an etching rate of the first isolation layer 21.

The third isolation layer 24 is provided on an inner wall of the second isolation layer 22, and a region defined by the second isolation layer 22 is filled with the third isolation layer 24.

In other words, the isolation structure 20 includes the first isolation layer 21, the second isolation layer 22, the barrier layer 23, and the third isolation layer 24. The first isolation layer 21, the second isolation layer 22, and the third isolation layer 24 are sequentially stacked. The top surface of the first isolation layer 21 is lower than the top surface of the substrate 10. A groove is defined between the second isolation layer 22 and the substrate 10, and the barrier layer 23 is provided in the groove and fills the groove. The etching rate of the barrier layer 23 is lower than the etching rate of the first isolation layer 21.

A material of the barrier layer 23 includes at least one of silicon carbide nitride, silicon carbon oxide, and silicon boron nitride. In other words, the material of the barrier layer 23 may be one or more of the foregoing three materials.

A material of the first isolation layer 21 and a material of the third isolation layer 24 may both include silicon oxide, and a material of the second isolation layer 22 may include silicon nitride.

In this embodiment, the etching rate of the barrier layer 23 is lower than the etching rate of the first isolation layer 21. In this way, the barrier layer 23 will not be damaged during forming of the isolation structure, and thus the isolation structure will not be damaged, thereby avoiding a leakage current between adjacent active regions and improving the performance of the semiconductor structure.

In some embodiments, the barrier layer 23 further includes an extension portion 231 located between the second isolation layer 22 and the third isolation layer 24.

In this embodiment, by providing the extension portion 231, the thickness of the third isolation layer 24 can be reduced. The extension portion 231 with a lower etching rate is used to replace a part of the third isolation layer 24, which can minimize the damage to the isolation structure 20 in the subsequent process of removing other film layers on the substrate, thereby avoiding a leakage current between adjacent active regions and improving the performance of the semiconductor structure.

In some embodiments, a top surface of the barrier layer 23 is higher than a top surface of the active region 11, and a gate oxide layer 60 is provided in a region defined by the barrier layer 23 and the active region 11.

In this embodiment, while the third isolation layer is formed, the gate oxide layer is formed at the same time, which can avoid forming a new gate oxide layer in the active region subsequently, thereby simplifying the manufacturing process of the semiconductor structure.

The gate oxide layer 60 is further provided with a gate structure 80 and an insulating layer 90. The gate structure 80 may include a first conductive layer 81 and a second conductive layer 82 that are sequentially stacked. The first conductive layer 81 is arranged on the gate oxide layer 60, and the insulating layer 90 is arranged on the second conductive layer 82. The gate oxide layer 60, the gate structure 80, and the insulating layer 90 form a transistor, which is used for controlling a semiconductor device located in an array region.

A material of the first conductive layer 81 may include polysilicon, a material of the second conductive layer 82 may include tungsten, and a material of the insulating layer 90 may include silicon nitride.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific is feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A manufacturing method of a semiconductor structure, comprising:
    providing a substrate, wherein trenches are provided in the substrate, and regions other than the trenches in the substrate form a plurality of active regions at intervals;
    forming a first isolation layer and a second isolation layer that are sequentially stacked on an inner wall of the trench, wherein a top surface of the first isolation layer is lower than a top surface of the second isolation layer, such that a groove is formed between the second isolation layer and the active region, and the second isolation layer defines an intermediate trench in the trench;
    forming a barrier layer in the groove, wherein an etching rate of the barrier layer is lower than an etching rate of the first isolation layer; and
    forming a third isolation layer in the intermediate trench, wherein the intermediate trench is filled with the third isolation layer, and the first isolation layer, the second isolation layer, the third isolation layer, and the barrier layer form an isolation structure;
    wherein the forming a first isolation layer and a second isolation layer that are sequentially stacked on an inner wall of the trench comprises:

forming a first initial isolation layer on the inner wall of the trench, wherein the first initial isolation layer covers a top surface of the substrate;

forming a second initial isolation layer on the first initial isolation layer; and removing the first initial isolation layer located on the top surface of the substrate and a part of the first initial isolation layer that is located on a sidewall of the trench, and removing the second initial isolation layer located on the top surface of the substrate, wherein the retained first initial isolation layer forms the first isolation layer, and the retained second initial isolation layer forms the second isolation layer; and wherein the removing the first initial isolation layer located on the top surface of the substrate and a part of the first initial isolation layer that is located on a sidewall of the trench, and removing the second initial isolation layer located on the top surface of the substrate further comprises:

removing the active region by a certain thickness, wherein a filling region is formed between the retained active region and the barrier layer.

2. The manufacturing method of a semiconductor structure according to claim 1, wherein the barrier layer is further provided with an extension portion located between the second isolation layer and the third isolation layer.

3. The manufacturing method of a semiconductor structure according to claim 2, wherein a material of the barrier layer comprises at least one of silicon carbide nitride, silicon carbon oxide, and silicon boron nitride.

4. The manufacturing method of a semiconductor structure according to claim 1, wherein the groove has a depth of 60 nm to 80 nm.

5. The manufacturing method of a semiconductor structure according to claim 1, wherein the forming a barrier layer in the groove comprises:

forming an initial barrier layer in the groove, wherein the initial barrier layer extends to an outside of the groove and covers a top surface of the active region and an inner wall of the second isolation layer; and removing the initial barrier layer located on the top surface of the active region, wherein the initial barrier layer retained in the groove forms the barrier layer, and the initial barrier layer retained on the inner wall of the second isolation layer forms an extension portion of the barrier layer.

6. The manufacturing method of a semiconductor structure according to claim 5, wherein the forming a third isolation layer in the intermediate trench comprises:

forming a third initial isolation layer in the intermediate trench, wherein the third initial isolation layer extends to an outside of the intermediate trench and covers the top surface of the second isolation layer and a top surface of the barrier layer as well as an interior of the filling region; and planarizing the third initial isolation layer, such that the third initial isolation layer located in the intermediate trench forms the third isolation layer, the third initial isolation layer located in the filling region forms a gate oxide layer, and a top surface of the gate oxide layer is flush with the top surface of the barrier layer.

7. The manufacturing method of a semiconductor structure according to claim 6, after the planarizing the third initial isolation layer, the manufacturing method further comprises:

forming a gate structure and an insulating layer that are sequentially stacked on the gate oxide layer.

8. A semiconductor structure, comprising:

a substrate, wherein trenches are provided in the substrate, and regions other than the trenches in the substrate form a plurality of active regions at intervals;

a first isolation layer, wherein the first isolation layer is provided on an inner wall of the trench;

a second isolation layer, wherein the second isolation layer is provided on the first isolation layer, and a top surface of the second isolation layer is higher than a top surface of the first isolation layer, such that the second isolation layer and the substrate define a groove;

a barrier layer, wherein the barrier layer is provided in the groove, and an etching rate of the barrier layer is lower than an etching rate of the first isolation layer; and a third isolation layer, wherein the third isolation layer is provided on an inner wall of the second isolation layer, and a region defined by the second isolation layer is filled with the third isolation layer;

wherein the first isolation layer and the second isolation layer are formed by:

forming a first initial isolation layer on the inner wall of the trench, wherein the first initial isolation layer covers a top surface of the substrate;

forming a second initial isolation layer on the first initial isolation layer; and removing the first initial isolation layer located on the top surface of the substrate and a part of the first initial isolation layer that is located on a sidewall of the trench, and removing the second initial isolation layer located on the top surface of the substrate, wherein the retained first initial isolation layer forms the first isolation layer, and the retained second initial isolation layer forms the second isolation layer; and wherein the removing the first initial isolation layer located on the top surface of the substrate and a part of the first initial isolation layer that is located on a sidewall of the trench, and removing the second initial isolation layer located on the top surface of the substrate further comprises:

removing the active region by a certain thickness, wherein a filling region is formed between the retained active region and the barrier layer.

9. The semiconductor structure according to claim 8, wherein a material of the barrier layer comprises at least one of silicon carbide nitride, silicon carbon oxide, and silicon boron nitride.

10. The semiconductor structure according to claim 8, wherein the barrier layer comprises an extension portion located between the second isolation layer and the third isolation layer.

11. The semiconductor structure according to claim 10, wherein a top surface of the barrier layer is higher than a top surface of the active region; and a gate oxide layer is provided in a region defined by the barrier layer and the active region.

12. The semiconductor structure according to claim 11, the semiconductor structure further comprises a gate structure and an insulating layer, wherein the gate structure comprises a first conductive layer and a second conductive layer that are sequentially stacked, the first conductive layer is arranged on the gate oxide layer, and the insulating layer is arranged on the second conductive layer.

13. The semiconductor structure according to claim 8, wherein a material of the first isolation layer and a material of the third isolation layer both comprise silicon oxide, and a material of the second isolation layer comprises silicon nitride.

\* \* \* \* \*